(12) United States Patent
Bazes (10) Patent No.: US 6,856,172 B1
(45) Date of Patent: Feb. 15, 2005

(54) SEQUENTIAL LOGIC CIRCUIT FOR FREQUENCY DIVISION

(75) Inventor: Mel Bazes, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/678,898

(22) Filed: Oct. 2, 2003

(51) Int. Cl.$^7$ .............................................. H03K 19/00
(52) U.S. Cl. .............................. 326/93; 326/46; 331/51
(58) Field of Search ............................ 326/46, 93–98; 331/51, 53; 327/117

(56) References Cited

U.S. PATENT DOCUMENTS

| | | | |
|---|---|---|---|
| 4,333,374 A | * 6/1982 | Okumura et al. | 84/604 |
| 5,036,216 A | * 7/1991 | Hohmann et al. | 327/157 |
| 5,123,030 A | * 6/1992 | Kazawa et al. | 375/294 |
| 6,269,051 B1 | * 7/2001 | Funaba et al. | 365/233 |
| 6,498,537 B1 | * 12/2002 | Watanabe | 331/25 |

* cited by examiner

Primary Examiner—Don Le
(74) Attorney, Agent, or Firm—Seth Z. Kalson (57) ABSTRACT

A circuit to divide down the frequency of a clock signal, where embodiment circuits comprise a set-reset flip-flop feeding its output to a shift register, and combinational logic to provide feedback from the shift register to the set input port, reset input port, or both set and reset input ports of the set-reset flip-flop. The set-reset flip-flop and shift register are clocked by the clock signal. The output signal of the circuit may be taken at any output port of the shift register or the set-reset flip-flop. In one embodiment, the state of the shift register is represented by the set of Boolean values Q<i>, i=1, 2, . . . , N−1, and the combinational logic provides to the set input port of the set-reset flip-flop the Boolean value {Q#<M−1>∧<Q#<M−2>∧. . . ∧Q#<0>}, where Q#<i>is the Boolean complement of Q<i>, Q#<0> is provided by the set-reset flip-flop, ∧ is Boolean AND, and M is a positive integer not greater than N; and the combinational logic also provides the Boolean value {Q<L−1>∧<Q<L−2>∧ . . . ∧Q<0>} to the reset input port of the set-reset flip-flop, where L is a positive integer not greater than N. For such an embodiment, the frequency of the output signal is that of the clock signal divided down by the divisor D where D L+M, and the duty cycle of the output signal is L/D.

13 Claims, 6 Drawing Sheets

SEQUENTIAL LOGIC CIRCUIT FOR FREQUENCY DIVISION

FIELD

Embodiments of the present invention relate to digital circuits, and more particularly, to synchronous sequential logic circuits for frequency division.

BACKGROUND

Figure 1:
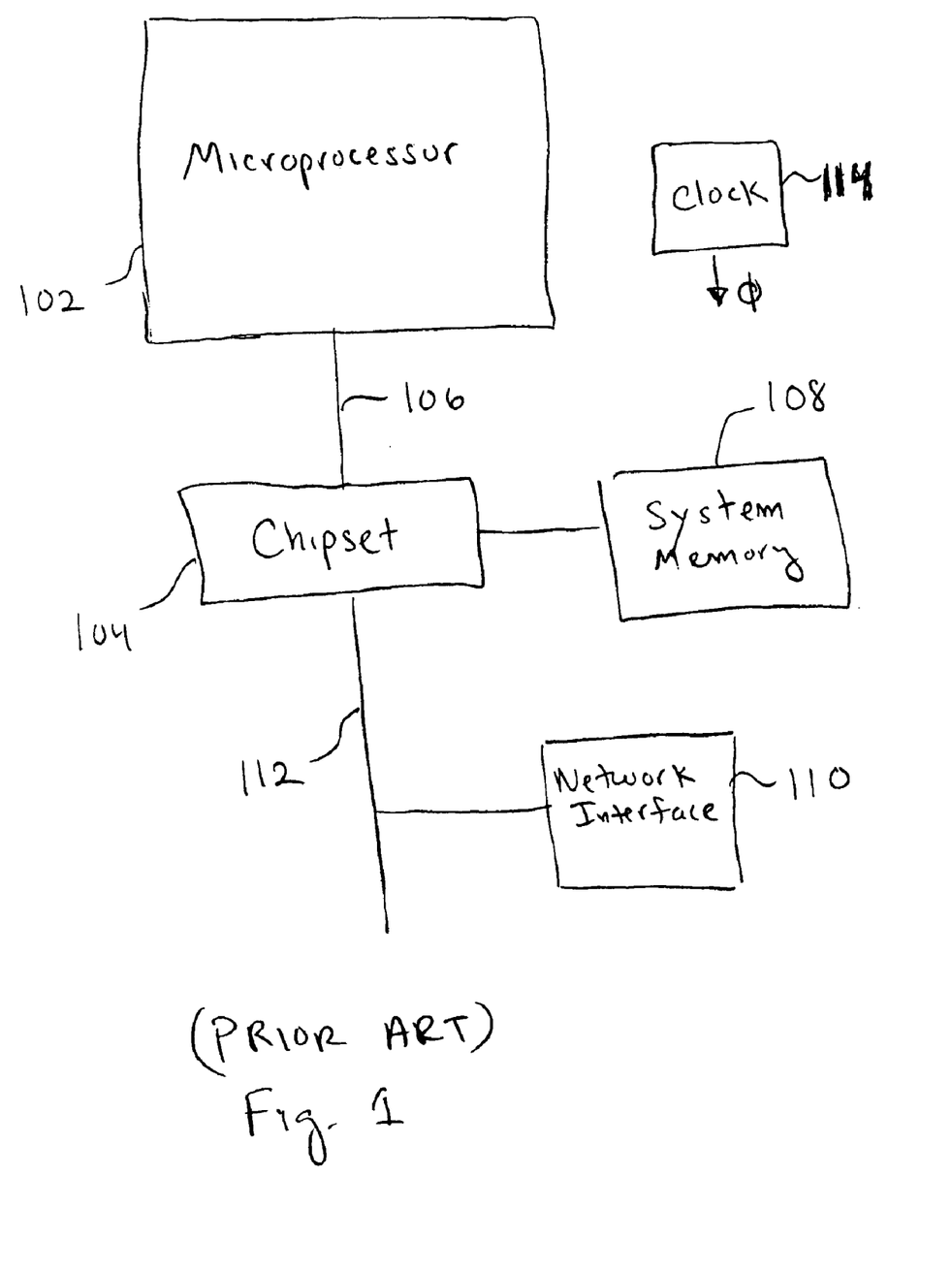
FIG. 1 illustrates a system view of a computer.

A frequency divider circuit provides an output signal having a frequency equal to 1/D that of the frequency of an input clock signal, where D may be termed the frequency divisor. That is, if F is the frequency of the input clock signal, then F/D is the frequency of the output signal. Such divider circuits find applications in a wide range of systems. For example, consider the computer system of FIG. 1. In FIG. 1, die 102 comprises a microprocessor that sends and receives signals (e.g., data and instructions) to chipset 104 via front side bus 106. Chipset 104 allows for communication with other system units, such as for example system memory 108. Chipset 104 usually provides communication with other system units, or peripherals, such as network interface 110 via bus 112. Other peripherals (not shown) may be connected to bus 112. Each of these functional units or peripherals may physically reside on one die or more than one dice. Some or parts of more than one functional unit or peripheral may reside on the same die. Clock circuit 114 provides a clock signal $\phi$ having a clock frequency. There may be more than one clock circuit, but for simplicity only one is shown in FIG. 1. Frequency divider circuits may be found in various system components, e.g., microprocessor, chipsets, or peripheral components, where the clock frequency of clock signal $\phi$ is to be divided down.

DESCRIPTION OF EMBODIMENTS

Figure 2:
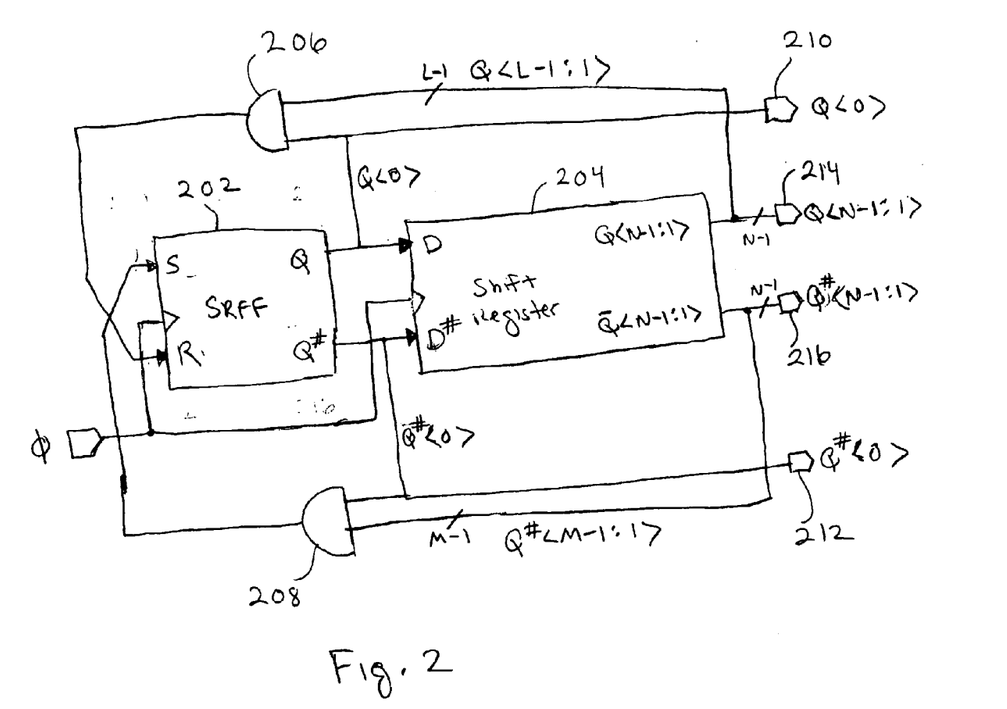
FIG. 2 illustrates an embodiment frequency divider.

An embodiment of a frequency divider is depicted in FIG. 2. In FIG. 2, component block 202 is an edge-triggered set-reset flip-flop (SRFF), component block 204 is an edge-triggered shift register, and component blocks 206 and 208 are each an AND gate. The input clock signal is denoted in FIG. 2 as $\phi$, which clocks SRFF 202 and shift register 204. The divider circuit of FIG. 2 is seen to be a synchronous sequential logic circuit, where there is feedback from some or all of the output ports to the input ports. This will be discussed in more detail later when describing the operation of the circuit.

The input ports of SRFF 202 are denoted in FIG. 2 as S and R, and the output ports of SRFF 202 are denoted as Q and Q#. The signals at the Q and Q# output ports represent complementary Boolean values, which we denote respectively as Q<0> and Q#<0>, where # denotes Boolean NOT (e.g., Q<0> is the Boolean complement of Q#<0>). Incurring a slight abuse of notation, let S and R also denote the Boolean values represented, respectively, by the voltages at input ports S and R. Then, the input-output relationship for SRFF 202 follows that of a typical SRFF and may be described as follows: for S=0 and R=0 there is no change in the output; for S=0 and R=1 (Reset condition), Q<0>=0; for S=1 and R=0 (Set condition), Q<0>=1; and the condition S=1 and R=1 is not normally allowed.

In the previous statement, 0 and 1 are identified as Boolean values, where we may take the convention that a Boolean 0 corresponds to a LOW voltage and a Boolean 1 corresponds to a HIGH voltage. The input-output relationship for SRFF 202 holds for positive edge transitions of the input clock signal $\phi$, but other embodiments need not be limited to positive edge transitions. The output voltage representative of Q<0> is provided at output port 210 and to an input port of AND gate 206. The output voltage representative of Q#<0> is provided at output port 212 and to an input port of AND gate 208.

The input ports to shift register 204 are denoted as D and D#, and it is seen that for the particular embodiment of FIG. 2, the signals at output ports Q and Q# are fed directly to input ports D and D#, respectively. Shift register 204 comprises N−1 edge-triggered D-type flip-flops, but other types of shift registers may be used. The Boolean values represented by the output signals of these flip-flops are written as the N−1 dimensional vectors Q<N−1:1> and Q#<N−1:1>, where each component of Q<N−1:1> is the Boolean complement of the corresponding component of Q#<N−1:1>. For simplicity, the output ports providing Q<N−1:1> are represented in FIG. 2 by output ports 214 and the output ports providing Q#<N−1:1> are represented by output ports 216. The state of the shift register may be represented by the vector of Boolean values Q<N−1:1>, or equivalently represented by the vector Q#<N−1:1>.

The components of these vectors are ordered so that the $i^{th}$ component (for i=2, ..., N−1) of Q<N−1:1>, which may be denoted as Q<i>, is the one unit delay version of the $(i−1)^{th}$ component of Q<N−1:1>, which may be denoted as Q<i−1>. That is, for i=2, ..., N−1, the Boolean value Q<i−1> is shifted into Q<i> in response to the clock signal, and we may write Q<i>=$z^{-1}$ Q<i−1> where $z^{-1}$ is the unit delay operator. A similar statement applies to the components of Q#<N−1:1>. If the components of vectors are written from right to left so that the component with the smallest index is written in the far right position, then we may define the N dimensional vector Q<N−1:0> as the vector [Q<N−1:1>Q<0>]. With this notation, Q<0> is the zeroth component of Q<N−1:0>. Similar statements apply to Q#<N−1:0> and Q#<0>. With the Q and Q# output ports of SRFF 202 connected to input ports D and D# of shift register 204, we have Q<1>=$z^{-1}$ Q<0> and Q#<1>=$z^{-1}$ Q#<0>. Consequently, the relationships Q<i>=$z^{-1}$ Q<i−1>and Q#<i>=$z^{-1}$ Q#<i−1>hold for the range i=1, 2, ..., N−1.

The first L−1 components of Q<N−1:1> are denoted in FIG. 2 as Q<L−1:1>. Likewise, the first M−1 components of Q#<N−1:1>are denoted in FIG. 2 as Q#<M−1:1>. The voltages representing the vector Q<L−1:1>are provided as input voltages to AND gate 206, and the voltages representing the vector Q#<M−1:1>are provided as input voltages to AND gate 208. The output voltage of AND gate 206 represents the Boolean AND of all its input Boolean values, and this output voltage is provided to the R input port of SRFF 202. Similarly, the output voltage of AND gate 208 is provided to the S input port of SRFF 202.

The operation of the frequency divider circuit of FIG. 2 will now be described, where it will be shown that during operation, the output signal of the divider circuit of FIG. 2 may be taken at any output port providing a component of Q<N−1:0> or Q#<N−1:0>; the frequency divisor is D where D=L+M; and the duty cycle of the output signal is L/D.

When the frequency divider circuit of FIG. 2 first powers up, the state of SRFF 202 and shift register 204 is most likely undefined and may have any set of possible values. Consequently, upon power-up, Q output port 210 of SRFF 202 may be either HIGH (representing a Boolean 1) or LOW (representing a Boolean 0), and likewise the Q output of each D-type flip-flop in shift register 204 may be either HIGH or LOW. Similar statements apply to the Q#outputs. That is, upon power-up, the components of the vectors Q<N−1:0> and Q#<N−1:0> may be either 1 or 0.

Assume for the moment that the Q output of SRFF 202 is HIGH at power-up. Then, while the Q output is HIGH a voltage representative of a Boolean 1 is shifted into the D input port of shift register 204 (and a voltage representative of a Boolean 0 is shifted into the D# input port) in each subsequent input-clock cycle. AND gate 206 receives input voltages representative of Q<0> and Q<L−1:1>. Consequently, when voltages representative of L−1 Boolean 1's have been shifted into the D input port of shift register 204, the output port of AND gate 206 goes HIGH, thereby resetting SRFF 202 and causing Q<0> to go to 0 on the subsequent clock. (Note that with the voltage representing Q<0> fed to AND gate 206 and the voltage representing Q#<0> fed to AND gate 208, the case where both R and S are equal to a Boolean 1 is avoided.) Thereafter, a voltage representing a Boolean 0 is shifted into the D input port and a voltage representing a Boolean 1 is shifted into the D# input port in each input-clock cycle until AND gate 208 evaluates HIGH. This occurs when (M−1) voltages representing a Boolean 0 have been shifted into the D input port, or equivalently, when (M−1) voltages representing a Boolean 1 have been shifted into the D# input port. When AND gate 208 goes HIGH, SRFF 202 is set, causing Q<0> to go to 1 on the subsequent input-clock cycle. Now the situation is as described at the beginning of this paragraph, and consequently there is a repeating cycle of Q<0> being 1 for L input-clock cycles followed by Q<0> being 0 for M input-clock cycles.

If the Q output of SRFF 202 were LOW instead of HIGH at power-up, then it should be clear that the operation of the frequency divider circuit is the same as described above, with only the order of events reversed (or time-shifted). Thus, the frequency divider circuit attains steady-state within one cycle of the output signal irrespective of its initial state without the need for a "reset" signal. Any voltage representing Q<i> or Q#<i> may be used as the output signal. However, for Q<i> or Q#<i> with i>0, during the first clock period after power-up the divider circuit outputs "garbage" as it flushes out the random contents of shift register 204. Furthermore, the output signal taken at the output port providing Q<i> or Q#<i>, when valid, is one input-clock period delayed with respect to the output signal taken at the output port providing Q<i−1>or Q#<i−1>, respectively.

From the above discussion, it is seen that regardless of the initial state of the Q output of SRFF 202, once steady-state has been reached there is a repeating cycle of Q<i> being 1 for L input-clock cycles followed by Q<i> being 0 for M input-clock cycles. Consequently, the frequency divider D is given by $$D=L+M,$$

and that the duty cycle is $$\text{duty cycle}=L/D.$$

Because L and M are the number of inputs to the two AND gates, configuring the frequency divider circuit to provide output signals having various frequencies and duty cycles is achieved by simply changing the number of input ports to the two AND gates.

Figure 3:
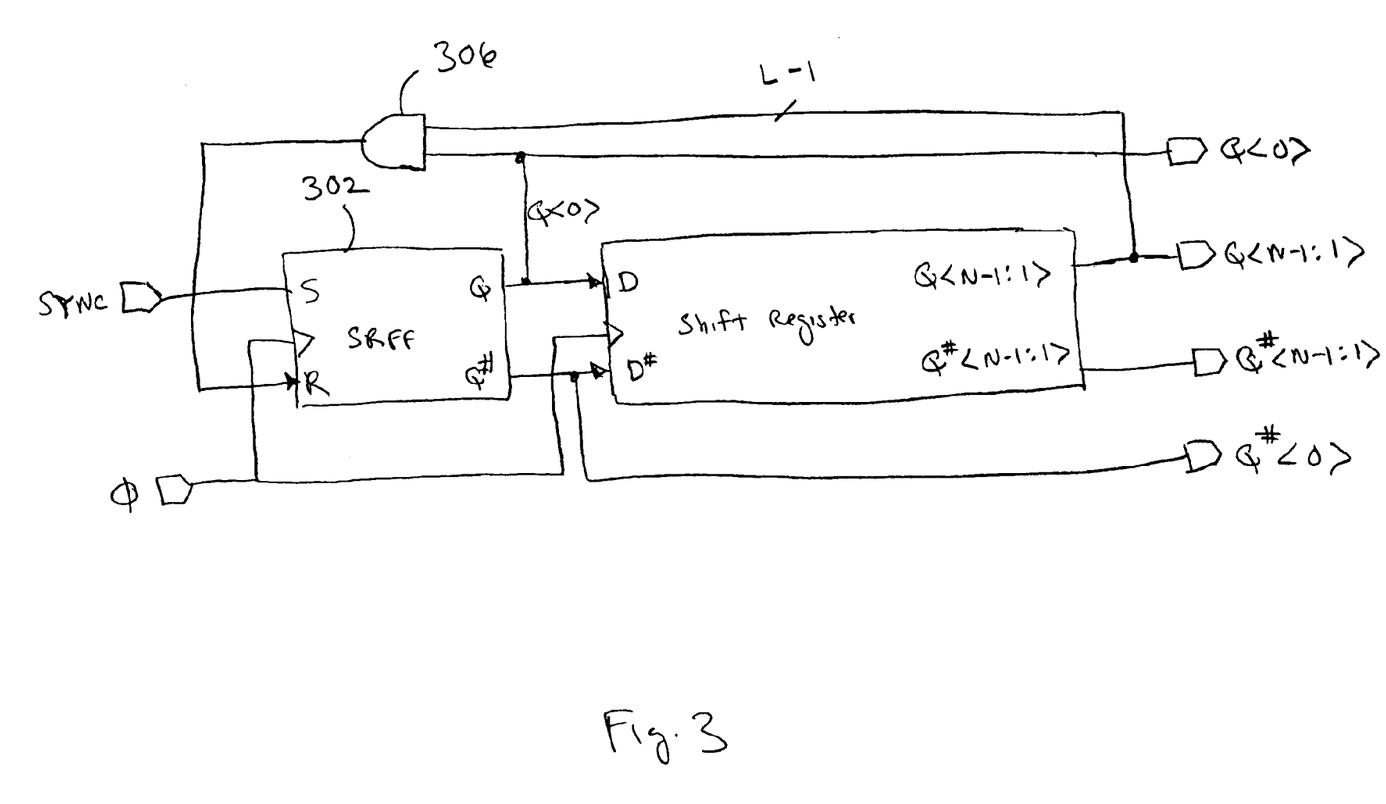
FIG. 3 illustrates an embodiment frequency divider with a SYNC pulse input.

In another embodiment, a frequency divider circuit may be synchronized to an external SYNC pulse, as shown in FIG. 3. The SYNC pulse, whose width equals one input-clock period, sets SRFF 302 every time it goes active, whereupon after L input-clock cycles, AND gate 306 resets SRFF 302. Thus, the frequency divisor D is not determined by the frequency divider circuit of FIG. 3, but rather, by the external SYNC pulse. In this case, the frequency divider circuit of FIG. 3 only sets L, so that the duty cycle is determined by both the divider circuit and the SYNC pulse as L/D.

Figure 4:
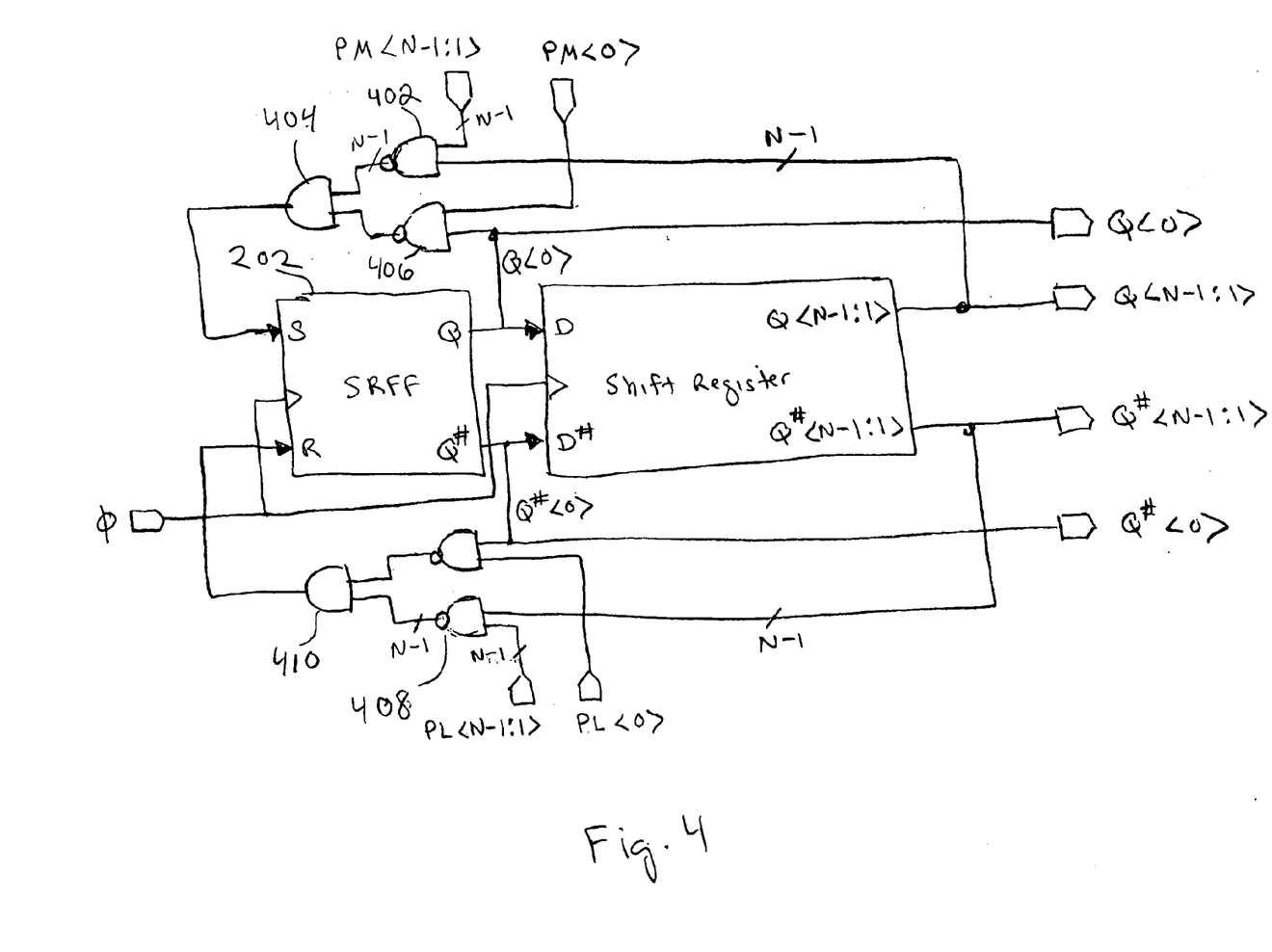
FIG. 4 illustrates an embodiment frequency divider with programmable frequency divisor and duty cycle.

In another embodiment, a frequency divider circuit may be programmed to vary either L, M, or both. One such embodiment is illustrated in FIG. 4. Input vector PL<N−1:0> programs L, and input signal vector PM<N−1:0> programs M. The voltages representing the components of PL<N−1:0> are such that the components of PL<i−1:0> are set to a Boolean 1 and the components of PL<N−1:i> are set to a Boolean 0 for some i=L, and the voltages representing the components of PM<N−1:0> are such that the components of PM<j−1:0> are set to a Boolean 1 and the components of PM<N−1:j> are set to a Boolean 0 for some j=M. NAND gate 402 performs a pair-wise Boolean NAND on each PM<k> and Q<k> for k=1, 2, . . . , N−1, providing N−1 outputs to N−1 input ports of AND gate 404. That is, letting OUT(k) for k=1, 2, . . . , N−1 denote the Boolean outputs of NAND gate 402, the N−1 outputs of NAND gate 402 are OUT(k)={PL<k>∧Q<k>}# for i=1, 2, . . . , N−1, where ∧ denotes Boolean AND. The output of NAND gate 406 performs a Boolean NAND on PM<0> and Q<0>, and provides its output to an input port of AND gate 404.

It is easily seen that the output voltage of AND gate 404 represents the Boolean AND of all the components of Q#<M−1:0>. That is, the output of AND gate 404 provides a voltage representative of the Boolean value {Q#<M−1> ∧<Q#<M−2>∧ . . . ∧Q#<0>}to the S port of SRFF 202. Similarly, NAND gate 408 performs a pair-wise Boolean NAND for each PL<k> and Q#<k> for k=1, 2, . . . , N−1 and provides its N−1 outputs to N−1 input ports of AND gate 410, and it is easily seen that AND gate 410 provides a voltage representative of the Boolean value {Q<L−1> ∧<Q<L−2>∧ . . . ∧Q<0>} to the R port of SRFF 202. The combinations of logic gates in FIG. 4 are now seen to be functionally identical to that of FIG. 2, but where now the L and M in FIG. 4 are programmable. Note that if PL<0> and PM<0> are each chosen as a Boolean 1, then the case in which both R and S are equal to a Boolean 1 is avoided.

Figure 5:
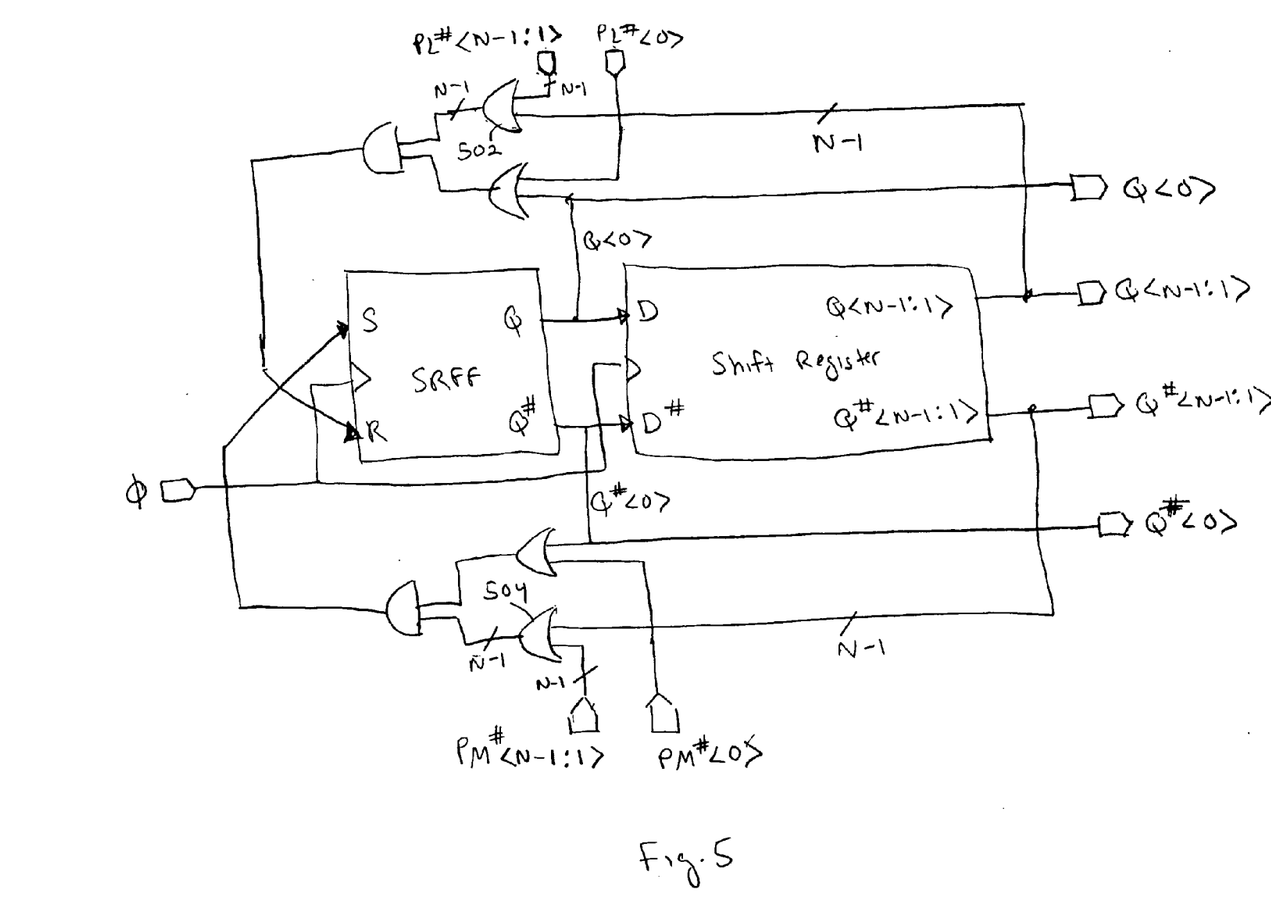
FIG. 5 illustrates another embodiment frequency divider with programmable frequency divisor and duty cycle.
Figure 6:
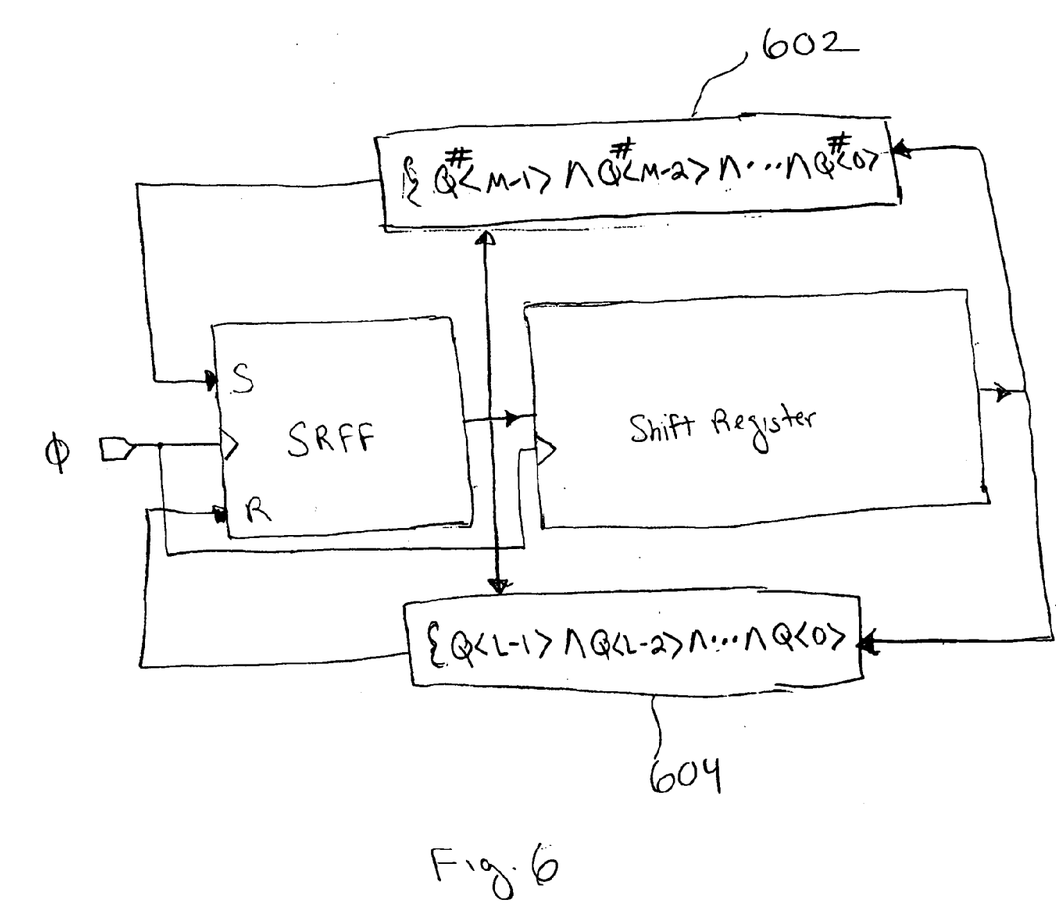
FIG. 6 abstracts the embodiments of FIGS. 2–5.

Many other combinations of logic gates may be utilized to provide a voltage representative of the Boolean value {Q#<M−1>∧<Q#<M−2>∧ . . . ∧Q#<0>} to the S port and a voltage representative of the Boolean value {Q<L−1> ∧<Q<L−2∧ . . . ∧Q<0>} to the R port of the set-reset flip-flop. For example, FIG. 5 illustrates another embodiment, where now gates 502 and 504 perform a pair-wise Boolean OR on each of their respective inputs, and the vectors PL#<N−1:0> and PM#<N−1:0> are provided as control vectors. Note that in FIG. 4, the inputs to combination of logic gates feeding into the S port are voltages representing the components of Q<N−1:0>, whereas in FIG. 5 the inputs to the combination of logic gates feeding into the S port are voltages representing the components of 'Q#<N−1:0>. With this in mind, the various embodiments discussed so far may be abstracted in FIG. 6, where combinational logic 602 provides a voltage representing the Boolean value {Q#<M−1>∧<Q#<M−2>∧ ... ∧Q#<0>} to the S port and combinational logic 604 provides a voltage representing the Boolean value {Q<L−1>∧<Q<L−2>∧ ... ∧Q<0>} to the R port. In FIG. 6, combinational logic 602 and 604 may or may not be programmable. Note that for the case in which a SYNC signal is provided to the S port, as in FIG. 3, combinational logic 602 need not be present. Furthermore, in other embodiments, a SYNC signal may be provided to the R port, in which case combinational logic 604 need not be present.

Implementation of combinational logic 602 and 604 is varied and well-known, and may involve basic Boolean logic gates having multiple input ports, such as multiple input AND logic gates, for example. The synthesis of such complex logic gates from simpler, basic logic gates is well-known. Similarly, the synthesis of set-reset flip-flops and shift registers is well known. Accordingly, many embodiments performing the set-reset flip-flop, shift register, and combinational logic functions described in these letters patent may be realized within the scope of the invention as claimed below.

Furthermore, it is to be understood in these letters patent that the phrase "A is connected to B" means that A and B are directly connected to each other, for example, by way of an interconnect, such as metal or polysilicon. This is to be distinguished from the phrase "A is coupled to B", which means that the connection between A and B may not be direct. That is, there may be an active passive element between A and B, or there may be an active device that couples A to B when ON. Furthermore, it is to be understood that a subset may or may not be a proper subset.

What is claimed is:

1. A circuit comprising:
a shift register, comprising an input port, to provide a set of output voltages representative of a set of Boolean values;
a set-reset flip-flop, comprising an input port, to provide at the input port of the shift register a voltage representative of an output Boolean value of the set-reset flip-flop; and
logic to provide at the input port of the set-reset flip-flop a voltage representative of the Boolean AND of a subset of the set of Boolean values of the shift register.

2. The circuit as set forth in claim 1, wherein the set-reset flip-flop comprises an S input port and a R input port, where the input port of the set-reset flip-flop is the R input port.

3. A circuit comprising:
a shift register having a state of N−1 Boolean values Q<i>, i=1, 2, ..., N−1, wherein in response to a clock signal the state changes so that Q<i−1> is shifted into Q<i> for i=2, ..., N−1;
a set-reset flip-flop comprising a SET input port having a voltage to represent a Boolean value S and a RESET input port having a voltage to represent a Boolean value R, the set-reset flip-flop to provide an output voltage representative of a Boolean value Q<0>, wherein in response to the clock signal Q<0> is a Boolean 1 when S is a Boolean 1 and Q<0> is a Boolean 0 when R is a Boolean 1, and wherein Q<0> does not change in response to the clock signal when both S and R are a Boolean 0, wherein in response to the clock signal Q<0> is shifted into Q<1>; and
logic to provide at the RESET input port a voltage representative of the Boolean value {Q<L−1>∧<Q<L−2>∧ ... ∧Q<0>} where ∧ is a Boolean AND and L is a positive integer not greater than N.

4. The circuit as set forth in claim 3, wherein the logic is to further provide at the SET input port a voltage representative of the Boolean value {Q#<M−1>∧<Q#<M−2>∧ ... ∧Q#<<0>} where Q#<i> is the Boolean complement of Q<i> and M is a positive integer not greater than N.

5. A circuit comprising:
a shift register having a state of N−1 Boolean values Q<i>, i=1, 2, ..., N−1, wherein in response to a clock signal the state changes so that Q<i−1> is shifted into Q<i> for i=2, ..., N−1;
a set-reset flip-flop comprising a SET input port having a voltage to represent a Boolean value S and a RESET input port having a voltage to represent a Boolean value R, the set-reset flip-flop to provide an output voltage representative of a Boolean value Q<0>, wherein in response to the clock signal Q<0> is a Boolean 1 when S is a Boolean 1 and Q<0> is a Boolean 0 when R is a Boolean 1, and wherein Q<0> does not change in response to the clock signal when both S and R are a Boolean 0, wherein in response to the clock signal Q<0> is shifted into Q<1>; and
logic to provide at the SET input port a voltage representative of the Boolean value {Q#<M−1>∧<Q#<M−2> ... ∧Q#<0>}, where ∧ is a Boolean AND, Q#<i> is the Boolean complement of Q<i>, and M is a positive integer not greater than N.

6. A system comprising:
a clock circuit to provide a clock signal, the clock signal having a first transition and a second transition in each clock cycle;
a shift register having a state of N−1 Boolean values Q<i>, i=1, 2, ..., N−1, wherein on each of the first transitions of the clock signal the state changes so that Q<i−1> is shifted into Q<i> for i=2, ..., N−1;
a set-reset flip-flop comprising a SET input port, a RESET input port, a clock input port to receive the clock signal, and to provide an output voltage representative of a Boolean value Q<0> on each of the first transitions of the clock signal so that Q<0> is shifted into Q<1>; and
logic to provide at the RESET input port a voltage representative of the Boolean value {Q<L−1>∧<Q<L−2>∧ ... ∧Q<0>} where ∧ is a Boolean AND and L is a positive integer not greater than N.

7. The system as set forth in claim 6, the logic to further provide at the SET input port a voltage representative of the Boolean value {Q#<M−1>∧<Q#<M−2>∧ ... ∧Q#<0>} where Q#<i> is the Boolean complement of Q<i> and M is a positive integer not greater than N.

8. The system as set forth in claim 6, wherein the first transition is a rising transition.

9. The system as set forth in claim 6, wherein the first transition is a falling transition.

10. A system comprising:
a clock circuit to provide a clock signal, the clock signal having a first transition and a second transition in each clock cycle;
a shift register having a state of N−1 Boolean values Q<i>, i=1, 2, ..., N−1, wherein on each of the first transitions of the clock signal the state changes so that Q<i−1> is shifted into Q<i> for i=2, ..., N−1;
a set-reset flip-flop comprising a SET input port, a RESET input port, a clock input port to receive the clock signal, and to provide an output voltage representative of a Boolean value Q<0> on each of the first transitions of the clock signal so that Q<0> is shifted into Q<1>; and logic to further provide at the SET input port a voltage representative of the Boolean value $\{Q\#<M-1> \wedge <Q\#<M-2> \wedge \ldots \wedge Q<0>\}$, where $\wedge$ is a Boolean AND, Q#<i> is the Boolean complement of Q<i>, and M is a positive integer not greater than N.

11. The system as set forth in claim 10, wherein the first transition is a rising transition.

12. The system as set forth in claim 10, wherein the first transition is a falling transition.

13. A circuit to divide down the frequency of an input clock signal, the circuit comprising:

a shift register;

a set-reset flip-flop comprising a set input port, a reset input port, and an output port coupled to the shift register; and combinational logic to provide feedback from the shift register and the set-reset flip-flop to at least one of the set or reset input ports.

* * * * *

UNITED STATES PATENT AND TRADEMARK OFFICE
CERTIFICATE OF CORRECTION

PATENT NO.     : 6,856,172 B1
DATED          : February 15, 2005
INVENTOR(S)    : Bazes It is certified that error appears in the above-identified patent and that said Letters Patent is hereby corrected as shown below:

Drawings,
Replace all drawings with the attached drawings.

Column 6,
Line 8, delete ""^Q#<<0>" and insert -- ^Q#<0> --.

Column 7,
Line 6, delete ""^Q<0>" and insert -- ^Q#<0> --.

Signed and Sealed this

Eleventh Day of October, 2005

JON W. DUDAS
*Director of the United States Patent and Trademark Office*